US008311169B2

(12) United States Patent
Okumura et al.

(10) Patent No.: US 8,311,169 B2
(45) Date of Patent: Nov. 13, 2012

(54) AUTOMATIC FREQUENCY MONITORING CIRCUIT, ELECTRONIC DEVICE, AUTOMATIC FREQUENCY MONITORING METHOD, AND AUTOMATIC FREQUENCY MONITORING PROGRAM

(75) Inventors: Hiroki Okumura, Fukuoka (JP); Satoshi Esaka, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 1229 days.

(21) Appl. No.: 11/877,772

(22) Filed: Oct. 24, 2007

(65) Prior Publication Data

US 2008/0152065 A1 Jun. 26, 2008

(30) Foreign Application Priority Data

Dec. 20, 2006 (JP) .................. 2006-343188

(51) Int. Cl.
*H04L 7/00* (2006.01)
(52) U.S. Cl. ...................... 375/354; 375/375
(58) Field of Classification Search .................. 375/375, 375/354
See application file for complete search history.

(56) References Cited

U.S. PATENT DOCUMENTS

| | | | | |
|---|---|---|---|---|
| 5,220,295 | A * | 6/1993 | Glover et al. | 331/25 |
| 5,570,382 | A * | 10/1996 | Miyamoto | 714/814 |
| 6,791,599 | B1 * | 9/2004 | Okada et al. | 348/56 |
| 7,134,042 | B2 | 11/2006 | Shimasaki | |
| 7,154,305 | B2 | 12/2006 | Driediger et al. | |
| 7,529,961 | B2 * | 5/2009 | Kondou | 713/502 |
| 2004/0177290 | A1 | 9/2004 | Shimasaki | |
| 2005/0163276 | A1 * | 7/2005 | Sudo et al. | 375/372 |
| 2005/0207752 | A1 * | 9/2005 | Kwon et al. | 398/25 |
| 2006/0132190 | A1 | 6/2006 | Driediger et al. | |

FOREIGN PATENT DOCUMENTS

| | | |
|---|---|---|
| EP | 1 434 057 | 6/2004 |
| EP | 1 675 267 | 6/2006 |
| JP | 04-233349 | 8/1992 |
| JP | 04-306930 | 10/1992 |
| JP | 2003-308131 | 10/2003 |
| JP | 2006-309479 A | 11/2006 |

OTHER PUBLICATIONS

European Search Report dated Apr. 3, 2008, from the corresponding European Application.
Japan Patent Office: Decision of Patent Grant mailed Nov. 30, 2010 in corresponding JP Patent Application No. 2006-343188, with partial English-language translation.

* cited by examiner

*Primary Examiner* — Aristocratis Fotakis
*Assistant Examiner* — Freshteh N Aghdam
(74) *Attorney, Agent, or Firm* — Fujitsu Patent Center

(57) ABSTRACT

An automatic frequency monitoring circuit automatically monitors a frequency of a clock related to an operation of a device to be monitored. In the automatic frequency monitoring circuit, a frequency detecting unit detects, upon detecting a predetermined momentum, the frequencies of a monitoring target clock during a predetermined time for a predetermined number of times and treats as a detection frequency of the monitoring target clock, an average of the frequencies that are detected for the predetermined number of times. A frequency monitoring unit monitors, upon the frequency detecting unit detecting the detection frequency of the monitoring target clock, whether the frequency of the monitoring target clock during the predetermined time is within a predetermined fluctuation range based on the detection frequency.

8 Claims, 8 Drawing Sheets

FIG.3

| REGISTER NUMBER | REGISTER NAME |
|---|---|
| 1 | MONITORING TIME SETTING |
| 2 | AUTOMATIC DETECTION YES/NO SETTING |
| 3 | RE-SETTING UPON AUTOMATIC DETECTION |
| 4 | RE-ACTIVATION INSTRUCTION SETTING |
| 5 | NUMBER OF SAMPLINGS |
| 6 | MINIMUM SETTING DURING MONITORING TIME (PERCENTAGE) |
| 7 | MAXIMUM SETTING DURING MONITORING TIME (PERCENTAGE) |
| 8 | NUMBER OF DETECTIONS DURING DETECTION TIME |
| 9 | WORK AREA OF NUMBER OF DETECTIONS DURING DETECTION TIME |
| 10 | MINIMUM ERROR RANGE SETTING OF NUMBER OF DETECTIONS DURING DETECTION TIME (PERCENTAGE) |
| 11 | MAXIMUM ERROR RANGE SETTING OF NUMBER OF DETECTIONS DURING DETECTION TIME (PERCENTAGE) |
| 12 | ENHANCEMENT DETECTING THRESHOLD (PERCENTAGE) |
| 13 | MINIMUM VALUE OF NUMBER OF DETECTIONS DURING MONITORING TIME |
| 14 | MAXIMUM VALUE OF NUMBER OF DETECTIONS DURING MONITORING TIME |
| 15 | NUMBER OF DETECTIONS DURING MONITORING TIME |

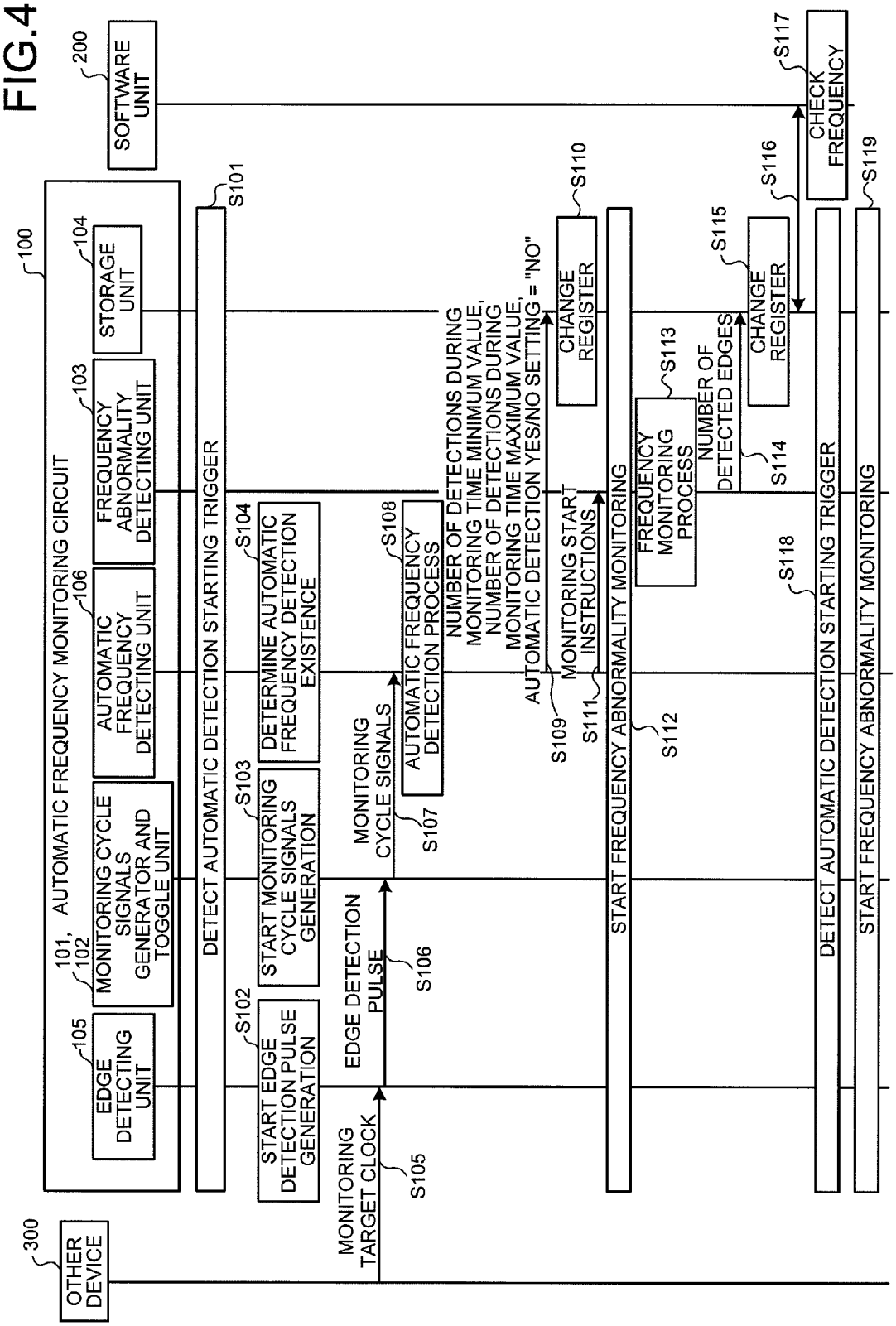

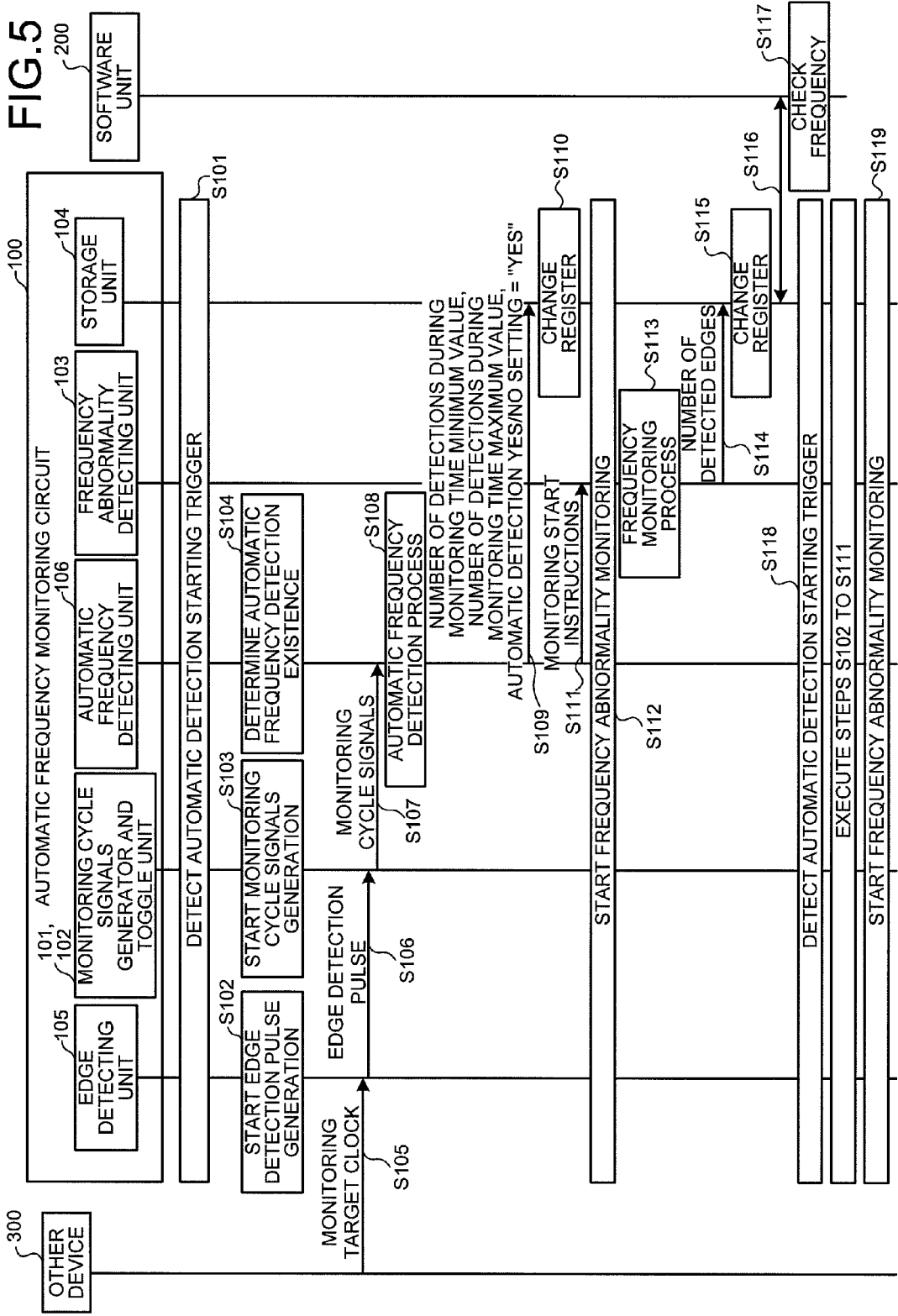

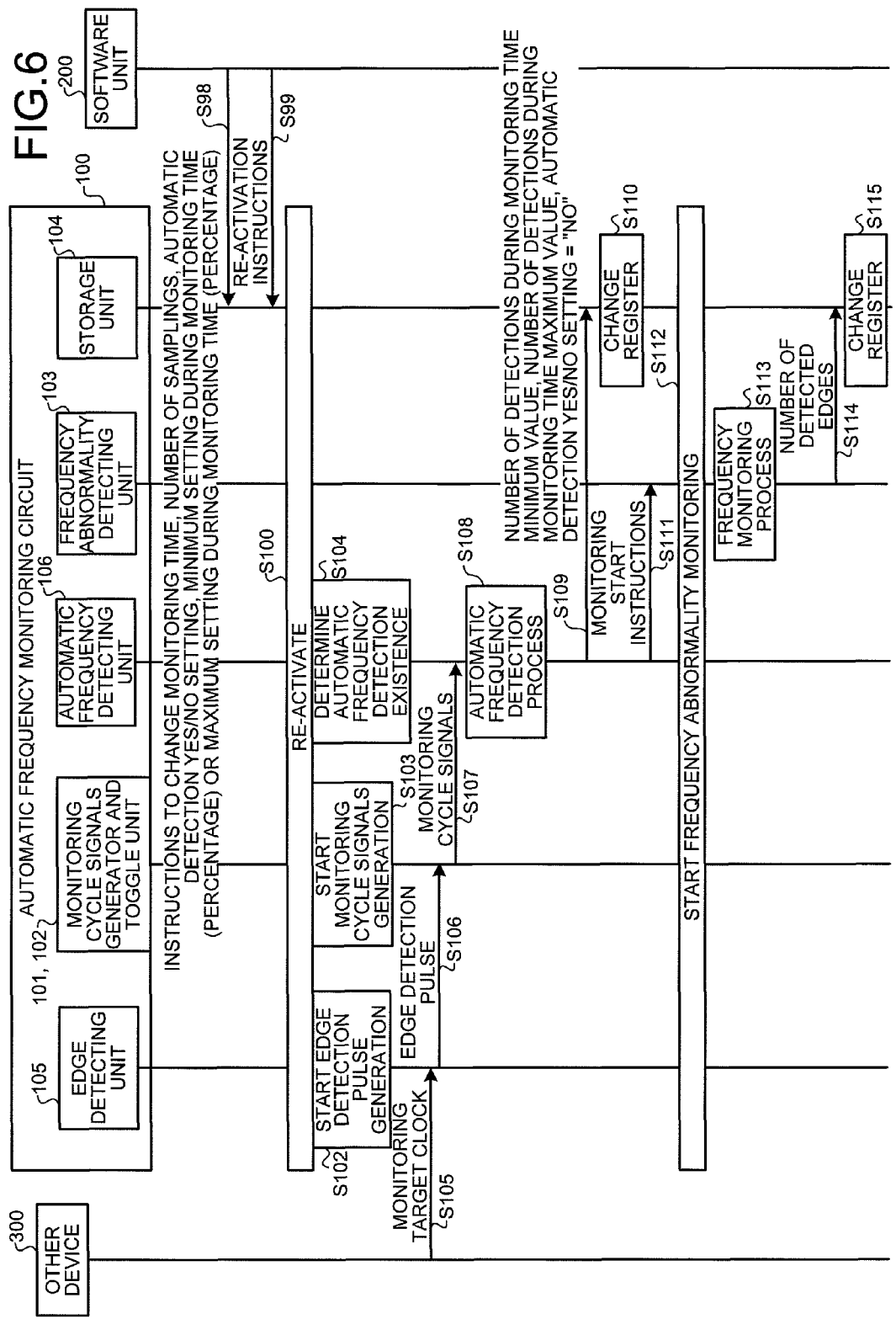

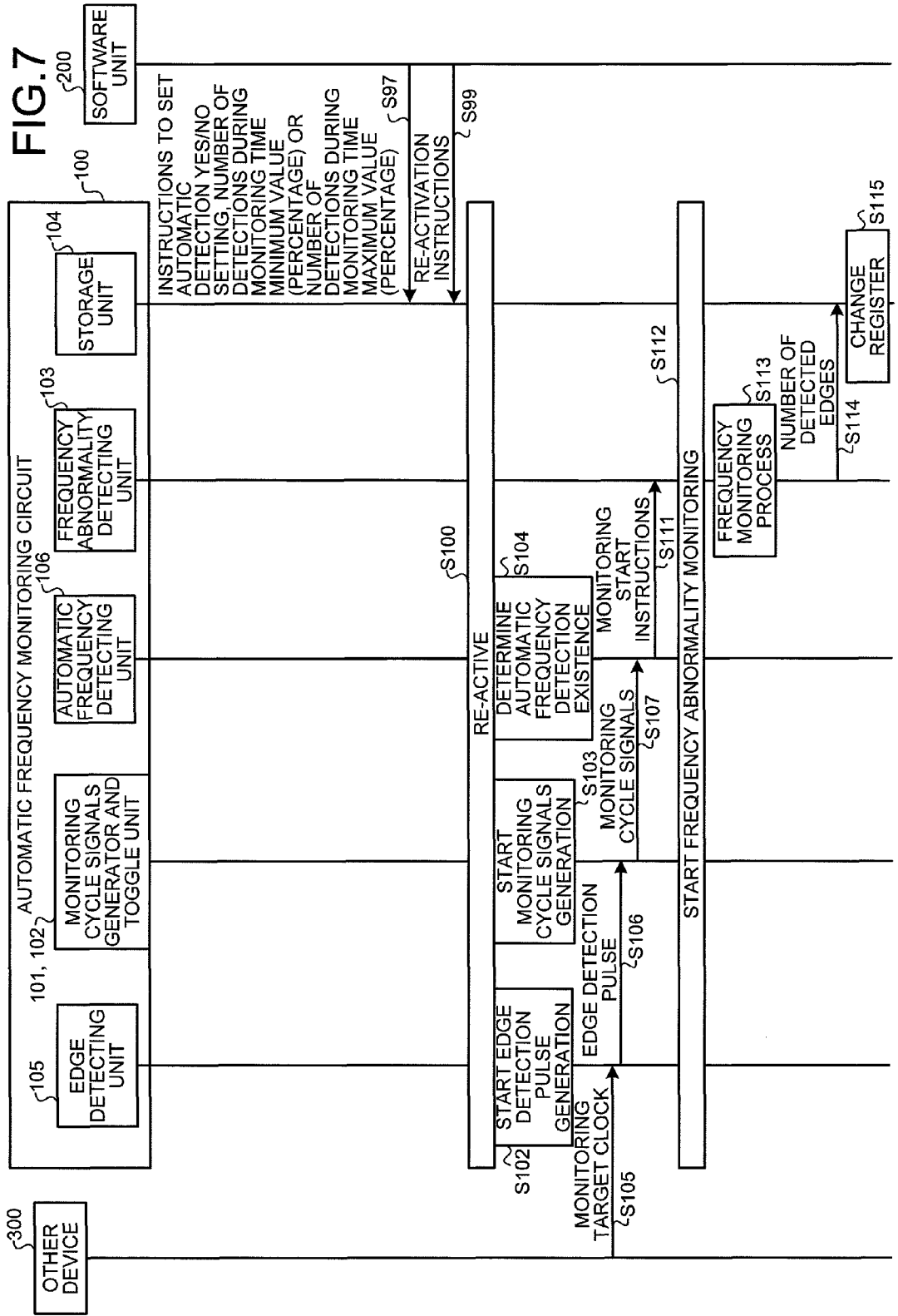

AUTOMATIC FREQUENCY MONITORING CIRCUIT, ELECTRONIC DEVICE, AUTOMATIC FREQUENCY MONITORING METHOD, AND AUTOMATIC FREQUENCY MONITORING PROGRAM

BACKGROUND OF THE INVENTION

1. Field of the Invention

The present invention relates to an automatic frequency monitoring circuit, an electronic device, an automatic frequency monitoring method, and an automatic frequency monitoring program that monitor a frequency of a clock related to an operation of a device to be monitored.

2. Description of the Related Art

Recently, electronic devices operate based on various clocks depending upon a type of a device. The monitoring of a clock has become more important as a reliability, availability, serviceability (RAS) function that maintains reliability, availability, and serviceability of operations of the electronic device.

For example, in Japanese Patent Application Laid-open No. H4-306930, a clock abnormality detector is disclosed that determines whether a frequency of a monitoring target clock is within a predetermined range. Because of the clock abnormality detector, the clock abnormality can be detected in an early stage.

Further, in Japanese Patent Application Laid-open No. H4-233349, to detect a frequency abnormality of an internal clock for master-slave synchronization with an external clock, an external clock abnormality detecting circuit is disclosed that notices the abnormality when the number of detections of a phase difference between the external clock and the internal clock is equal to or more than a predetermined value.

However, in the conventional technologies that are represented by Japanese Patent Application Laid-open Nos. H4-306930 and H4-233349, when the frequency of the clock is increased to improve the performance of the electronic device when the monitoring target clock is provided externally, a configuration of the device itself is not required to be changed but the configuration for detecting the clock abnormality is required to be changed.

Further, because a threshold that determines the abnormality of the clock is already fixed, even when the threshold is to be changed after the clock monitoring is started, the configuration for detecting the clock abnormality is required to be changed.

SUMMARY OF THE INVENTION

It is an object of the present invention to at least partially solve the problems in the conventional technology.

According to one aspect of the present invention, an automatic frequency monitoring circuit automatically monitors a frequency of a clock related to an operation of a device to be monitored. The automatic frequency monitoring circuit includes a frequency detecting unit that detects, upon detecting a predetermined momentum, the frequencies of a monitoring target clock during a predetermined time for a predetermined number of times and treats as a detection frequency of the monitoring target clock, an average of the frequencies that are detected for the predetermined number of times, and a frequency monitoring unit that monitors, upon the frequency detecting unit detecting the detection frequency of the monitoring target clock, whether the frequency of the monitoring target clock during the predetermined time is within a predetermined fluctuation range based on the detection frequency.

According to another aspect of the present invention, an electronic device automatically monitors a frequency of a clock related to an operation of the electronic device itself. The electronic device includes a frequency detecting unit that detects, upon detecting a predetermined momentum, the frequencies of a monitoring target clock during a predetermined time for a predetermined number of times and treats as a detection frequency of the monitoring target clock, an average of the frequency that is detected for the predetermined number of times, and a frequency monitoring unit that monitors, upon the frequency detecting unit detecting the detection frequency of the monitoring target clock, whether the frequency during the predetermined time is within a predetermined fluctuation range based on the detection frequency.

According to still another aspect of the present invention, an automatic frequency monitoring method automatically monitors a frequency of a clock related to an operation of a device to be monitored. The automatic frequency monitoring method includes frequency detecting including detecting, upon detecting a predetermined momentum, the frequencies of a monitoring target clock during a predetermined time for a predetermined number of times and treating as a detection frequency of the monitoring target clock, an average of the frequencies that are detected for the predetermined number of times, and monitoring, upon the frequency detecting detecting the detection frequency of the monitoring target clock, whether the frequency of the monitoring target clock during the predetermined time is within a predetermined fluctuation range based on the detection frequency.

According to still another aspect of the present invention, a computer-readable recording medium stores therein a computer program for automatically monitoring a frequency of a clock related to an operation of a device to be monitored. The computer program causes a computer to execute frequency detecting including detecting, upon detecting a predetermined momentum, the frequencies of a monitoring target clock during a predetermined time for a predetermined number of times and treating as a detection frequency of the monitoring target clock, an average of the frequencies that are detected for the predetermined number of times; and monitoring, upon the frequency detecting detecting the detection frequency of the monitoring target clock, whether the frequency of the monitoring target clock during the predetermined time is within a predetermined fluctuation range based on the detection frequency.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 3 is a table of storage contents of a storage unit;

FIG. 4 is a time chart (1) of automatic frequency monitoring processes;

FIG. 5 is a time chart (2) of the automatic frequency monitoring processes;

FIG. 6 is a time chart (3) of the automatic frequency monitoring processes;

FIG. 7 is a time chart (4) of the automatic frequency monitoring processes.

DETAILED DESCRIPTION OF THE PREFERRED EMBODIMENTS

Exemplary embodiments of the automatic frequency monitoring circuit, the electronic device, the automatic frequency monitoring method, and the automatic frequency monitoring program according to the present invention are explained in detail below with reference to the accompanying drawings. The automatic frequency monitoring circuit, the automatic frequency monitoring method, and the automatic frequency monitoring program can be widely applied and installed in the electronic device that includes a controlling circuit that carries out clock operations. Further, the automatic frequency monitoring circuit, the automatic frequency monitoring method, and the automatic frequency monitoring program can also be installed on an automatic frequency monitoring device that is connected to or embedded in the electronic device to be monitored.

Figure 1:
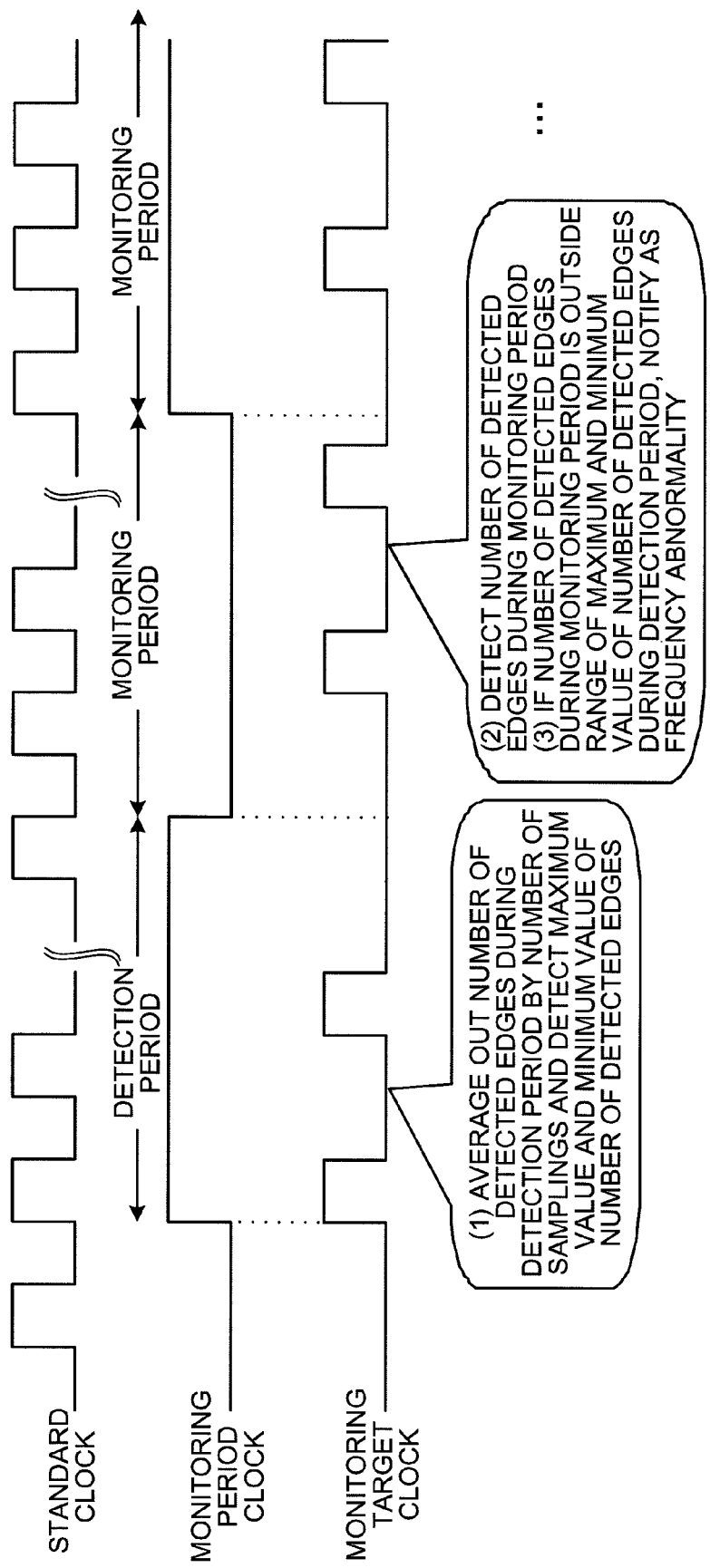
FIG. 1 is a schematic diagram of an overview and features of the present invention.

Before explaining the embodiments, an overview and features of the present invention are explained. FIG. 1 is a schematic diagram of the overview and features of the present invention. A period from a leading edge of pulse to a trailing edge of pulse or from the trailing edge of pulse to the leading edge of pulse of a monitoring period clock that is generated based on a standard clock is called one monitoring period (or a detection period). During the monitoring period, the number of leading edges of pulse (edges) of a monitoring target clock is monitored and during the detection period, the number of leading edges of pulse (number of detected edges) of the monitoring target clock is detected. A time length of the monitoring period matches with the detection period. To be specific, based on the number of leading edges of pulse that is detected during the detection period, the number of leading edges of pulse that is detected during the monitoring period is monitored.

Further, in the embodiment mentioned below, it is monitored whether the number of edges (number of leading edges of pulse) per predetermined time is within a predetermined range. When the detection period is considered as a unit time, the number of edges matches with the frequency. In other words, the number of edges per predetermined time is equivalent to the frequency.

As shown in FIG. 1, first, detection of the edges during the detection period is repeated for the number of samplings. The number of detected edges for the number of samplings is averaged by the number of samplings. A maximum and minimum values of the number of detected edges that are obtained according to the average and a setting value are calculated and stored.

Next, the edges during the monitoring period are detected and it is verified that the number of detected edges is within a range from the minimum value to the maximum value of the calculated number of detected edges. If the number of detected edges in the verification result is outside the range from the minimum value to the maximum value of the calculated number of detected edges, the frequency of the clock is notified as abnormal.

Thus, in the present invention, based on the number of detected edges during the detection period of the monitoring target clock that is automatically detected, the range of the number of detected edges that can be considered as normal is determined. Upon verifying whether the number of detected edges during the monitoring period of the monitoring target clock is considered as normal based on the range, even if the frequency of the monitoring target clock is changed, because the changes are carried out automatically, the monitoring target clock can be monitored without changing a structure or a setting of any clock monitoring circuit.

Figure 2:
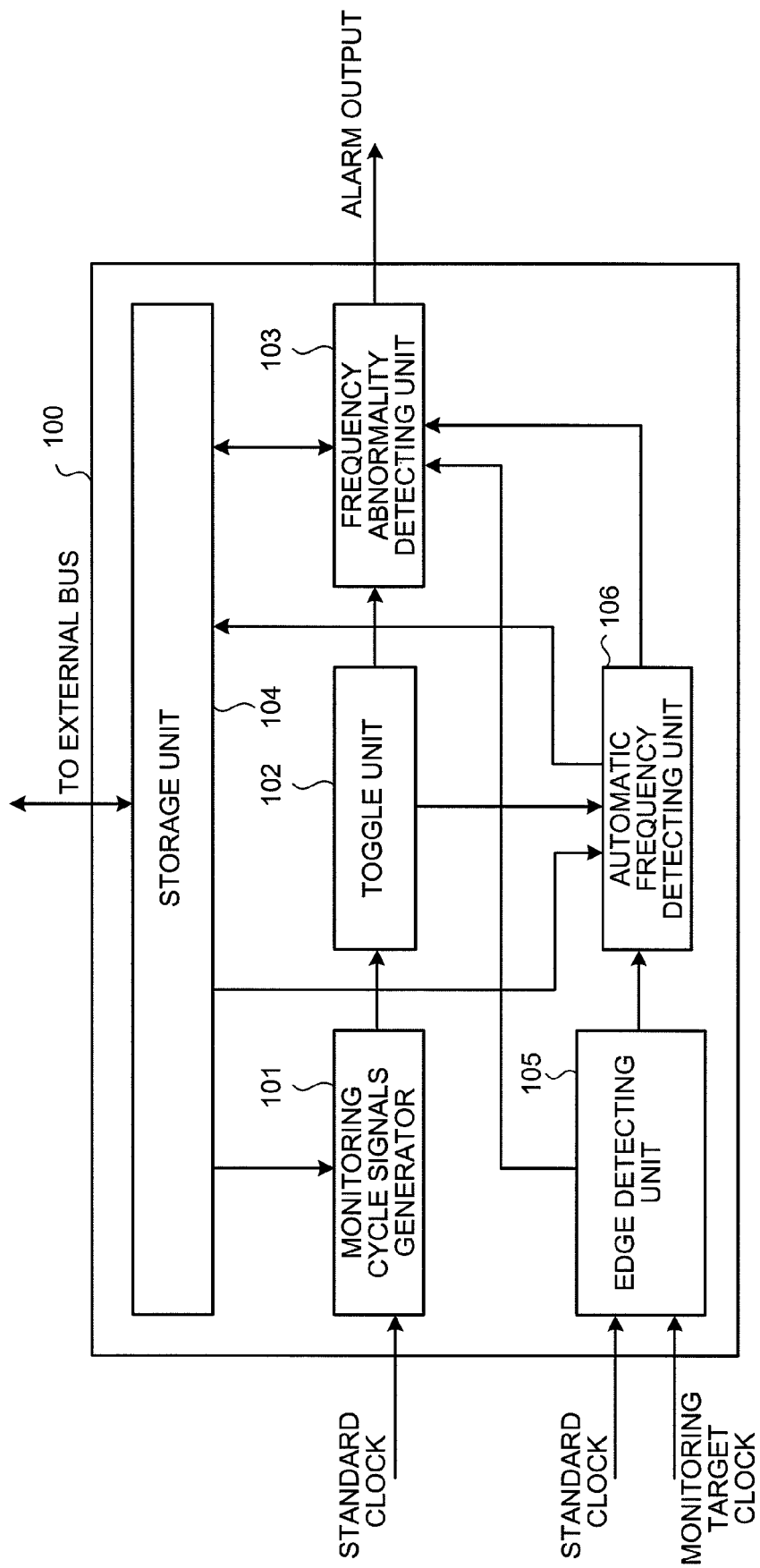
FIG. 2 is a functional block diagram of an automatic frequency detecting circuit according to an embodiment of the present invention.

The embodiment according to the present invention is explained below with reference to FIGS. 2 to 8. The structure of the automatic frequency monitoring circuit according to the embodiment of the present invention is explained first. FIG. 2 is a functional block diagram of the automatic frequency monitoring circuit according to the embodiment of the present invention. As shown in FIG. 2, an automatic frequency monitoring circuit 100 includes a monitoring cycle signals generator 101, a toggle unit 102 that carries out reversal of a pulse, a frequency abnormality detecting unit 103, a storage unit 104 that is a register, an edge detecting unit 105, and an automatic frequency detecting unit 106.

The monitoring cycle signals generator 101 reads MONITORING TIME SETTING from the storage unit 104 and in cooperation with the toggle unit 102, generates monitoring cycle signals that decide the monitoring period based on the standard clock. The monitoring cycle signals are passed to the frequency abnormality detecting unit 103 and the automatic frequency detecting unit 106.

Based on the standard clock and the monitoring target clock, the edge detecting unit 105 starts generation of edge pulses of the monitoring target clock. The edge pulses of the monitoring target clock are passed to the frequency abnormality detecting unit 103 and the automatic frequency detecting unit 106.

The automatic frequency detecting unit 106, first, calculates a ratio between values stored in NUMBER OF DETECTIONS DURING DETECTION TIME and NUMBER OF DETECTIONS DURING MONITORING TIME of the storage unit 104. If the ratio is equal to or more than ENHANCEMENT DETECTING THRESHOLD (PERCENTAGE) of the storage unit 104, it is determined that the monitoring target clock is enhanced (over clocking) and processes mentioned below are executed. If the ratio is less than the ENHANCEMENT DETECTING THRESHOLD (PERCENTAGE) of the storage unit 104, it is determined that the monitoring target clock is not enhanced and all the processes mentioned below are canceled.

Thus, if the ratio between the values stored in the NUMBER OF DETECTIONS DURING DETECTION TIME and the NUMBER OF DETECTIONS DURING MONITORING TIME of the storage unit 104 is equal to or more than the ENHANCEMENT DETECTING THRESHOLD (PERCENTAGE) of the storage unit 104, it is determined that the monitoring target clock is enhanced (over clocking). Thus, the enhancement is automatically detected and the NUMBER OF DETECTIONS DURING DETECTION TIME can be updated automatically. The automatic monitoring of the frequency can be continued.

For example, when the ENHANCEMENT DETECTING THRESHOLD (PERCENTAGE) is "200%", the NUMBER OF DETECTIONS DURING DETECTION TIME is "1200" and the NUMBER OF DETECTIONS DURING MONITORING TIME is "400", NUMBER OF DETECTIONS DURING MONITORING TIME over NUMBER OF DETECTIONS DURING DETECTION TIME multiplied by 100 is equal to 200%. Because the value is equal to or more than the ENHANCEMENT DETECTING THRESHOLD (PERCENTAGE), it is considered that the monitoring target clock is enhanced.

Without detecting enhancement automatically, the automatic frequency monitoring circuit 100 may also identify enhancement based on external instructions. Thus, the ENHANCEMENT DETECTING THRESHOLD of the storage unit 104 can be omitted.

Further, based on storage contents of AUTOMATIC DETECTION YES/NO SETTING of the storage unit 104, the automatic frequency detecting unit 106 determines whether the automatic frequency detection is to be carried out. If the automatic frequency detection is to be carried out, the automatic frequency detecting unit 106 counts the number of detected leading edges of edge pulse signals during the monitoring time that is stored in the monitoring time setting of the storage unit 104. The counting is carried out for the number of times stored in the NUMBER OF SAMPLINGS of the storage unit 104. The number of detected leading edges of the edge pulse signals is averaged by the number of samplings and is stored as the number of detected edges (corresponding to the frequency) per monitoring unit time in WORK AREA OF NUMBER OF DETECTIONS DURING DETECTION TIME of the storage unit 104.

Further, the automatic frequency detecting unit 106 calculates the ratio between the values stored in the WORK AREA OF NUMBER OF DETECTIONS DURING DETECTION TIME and the NUMBER OF DETECTIONS DURING DETECTION TIME of the storage unit 104. If the ratio is within the range that is decided in the MINIMUM ERROR RANGE SETTING OF NUMBER OF DETECTIONS DURING DETECTION TIME (PERCENTAGE) and MAXIMUM ERROR RANGE SETTING OF NUMBER OF DETECTIONS DURING DETECTION TIME (PERCENTAGE), it is considered that the number of detected edges per monitoring unit time is not changed and the value stored in the NUMBER OF DETECTIONS DURING DETECTION TIME is not updated by the value stored in the WORK AREA OF NUMBER OF DETECTIONS DURING DETECTION TIME.

However, if the ratio is outside the range that is decided in the MINIMUM ERROR RANGE SETTING OF NUMBER OF DETECTIONS DURING DETECTION TIME (PERCENTAGE) and the MAXIMUM ERROR RANGE SETTING OF NUMBER OF DETECTIONS DURING DETECTION TIME (PERCENTAGE), it is considered that the number of detected edges per monitoring unit time is changed and the value stored in the NUMBER OF DETECTIONS DURING DETECTION TIME is updated by the value stored in the WORK AREA OF NUMBER OF DETECTIONS DURING DETECTION TIME.

For example, if the MINIMUM ERROR RANGE SETTING OF NUMBER OF DETECTIONS DURING DETECTION TIME (PERCENTAGE) is "1%", the MAXIMUM ERROR RANGE SETTING OF NUMBER OF DETECTIONS DURING DETECTION TIME (PERCENTAGE) is "1%" and the NUMBER OF DETECTIONS DURING MONITORING TIME is "200", NUMBER OF DETECTIONS DURING MONITORING TIME minus NUMBER OF DETECTIONS DURING MONITORING TIME multiplied by MINIMUM ERROR RANGE SETTING OF NUMBER OF DETECTIONS DURING DETECTION TIME (PERCENTAGE) is equal to 198 (times). NUMBER OF DETECTIONS DURING MONITORING TIME plus NUMBER OF DETECTIONS DURING MONITORING TIME multiplied by MAXIMUM ERROR RANGE SETTING OF NUMBER OF DETECTIONS DURING DETECTION TIME (PERCENTAGE) is equal to 202 (times). If the ratio between the values stored in the WORK AREA OF NUMBER OF DETECTIONS DURING DETECTION TIME and the NUMBER OF DETECTIONS DURING DETECTION TIME of the storage unit 104 is within the range from "198" to "202", it is considered that the number of detected edges per monitoring unit time is not changed. If the ratio is outside the range, it is considered that the number of detected edges per monitoring unit time is changed.

Thus, when it is considered that the number of detected edges per monitoring unit time is not changed and the NUMBER OF DETECTIONS DURING DETECTION TIME is not updated, because a standard of the frequency monitoring is not to be changed unnecessarily for an error, basic consistency of monitoring frequency can be maintained, thereby enabling to enhance reliability of the automatic frequency monitoring.

Without limiting to the ratio (percentage), the values of the MINIMUM ERROR RANGE SETTING OF NUMBER OF DETECTIONS DURING DETECTION TIME and the MAXIMUM ERROR RANGE SETTING OF NUMBER OF DETECTIONS DURING DETECTION TIME may define the values that indicate the numbers of times. In this constitution, the automatic frequency detecting unit 106 calculates a difference between the values stored in the WORK AREA OF NUMBER OF DETECTIONS DURING DETECTION TIME and the NUMBER OF DETECTIONS DURING DETECTION TIME of the storage unit 104 and determines whether the number of detected edges per monitoring unit time is changed by determining whether the difference is within the range that is decided in the MINIMUM ERROR RANGE SETTING OF NUMBER OF DETECTIONS DURING DETECTION TIME and the MAXIMUM ERROR RANGE SETTING OF NUMBER OF DETECTIONS DURING DETECTION TIME.

Further, if the value stored in the NUMBER OF DETECTIONS DURING DETECTION TIME of the storage unit 104 is updated, the automatic frequency detecting unit 106 calculates a minimum value of the a number of detections during monitoring time by multiplying the number of detected edges per monitoring unit time by a minimum setting during detection time (percentage) of the storage unit 104 and stores the calculated minimum value in the MINIMUM VALUE OF NUMBER OF DETECTIONS DURING MONITORING TIME of the storage unit 104. Further, the automatic frequency detecting unit 106 calculates maximum value of the number of detections during monitoring time by multiplying the number of detected edges per monitoring unit time by a MAXIMUM SETTING DURING DETECTION TIME (PERCENTAGE) of the storage unit 104 and stores the calculated maximum value in the MAXIMUM VALUE OF NUMBER OF DETECTIONS DURING MONITORING TIME of the storage unit 104.

Based on the storage contents of RE-SETTING UPON AUTOMATIC DETECTION of the storage unit 104, the automatic frequency detecting unit 106 determines whether it should be reset upon automatic detection. If it should not be reset upon automatic detection, the automatic frequency detecting unit 106 sets "No" in the automatic detection Yes/No setting of the storage unit 104. Due to this, automatic detection is not carried out again and the initially detected number of detections during detection time continually becomes valid.

Next, if the processes are executed until setting "No" in the AUTOMATIC DETECTION YES/NO SETTING of the storage unit 104, the automatic frequency detecting unit 106 instructs the frequency abnormality detecting unit 103 for starting the frequency monitoring. Upon receiving the instructions, the frequency abnormality detecting unit 103 starts monitoring of the monitoring target clock.

Next, the storage contents of the storage unit indicated in FIG. 2 are explained. FIG. 3 is a table of the storage contents of the storage unit indicated in FIG. 2. As shown in FIG. 3, the MONITORING TIME SETTING of a register number "1" is a read/writable field that stores therein the value of the monitoring time that is divided as per the standard clock cycle. By increasing the setting value of the MONITORING TIME SETTING, the accuracy in detecting the abnormality of the frequency can be improved.

The AUTOMATIC DETECTION YES/NO SETTING of the register number "2" is the read/writable field that includes flag data and regulates the automatic detection. The RE-SETTING UPON AUTOMATIC DETECTION of the register number "3" is the read/writable field that includes flag data. Upon performing the initial automatic detection, the RE-SETTING UPON AUTOMATIC DETECTION regulates whether next automatic detection is to be carried out.

RE-ACTIVATION INSTRUCTION SETTING of the register number "4" is the read/writable field that stores therein data to carry out instructions to re-activate the automatic frequency monitoring circuit when the storage contents of the storage unit 104 are rewritten.

The NUMBER OF SAMPLINGS of the register number "5" is the read/writable field that indicates the number of samplings at the time of the automatic detection. By increasing the number of samplings, the accuracy in detecting the abnormality of the frequency can be improved.

MINIMUM SETTING DURING MONITORING TIME (PERCENTAGE) of the register number "6" is the read/writable field that indicates in percentage, a lower limit of the ratio of the difference in the number of detections during monitoring time that is approved at the time of monitoring the frequency. The value can only be set and changed externally. MAXIMUM SETTING DURING MONITORING TIME (PERCENTAGE) of the register number "7" is the read/writable field that indicates in percentage, an upper limit of the ratio of the difference in the number of detections during monitoring time that is approved at the time of monitoring the frequency. The value can only be set and changed externally.

The NUMBER OF DETECTIONS DURING DETECTION TIME of the register number "8" is the read/writable field. In the NUMBER OF DETECTIONS DURING DETECTION TIME, the value stored in the later mentioned WORK AREA OF NUMBER OF DETECTIONS DURING DETECTION TIME is copied upon satisfying a predetermined condition and the number of detected edges per monitoring unit time that is detected by the automatic frequency detection is stored. The WORK AREA OF NUMBER OF DETECTIONS DURING DETECTION TIME of the register number "9" is the read/writable field that stores therein the number of detected edges per monitoring unit time that is detected by the current automatic frequency detection.

The MINIMUM ERROR RANGE SETTING OF NUMBER OF DETECTIONS DURING DETECTION TIME (PERCENTAGE) of the register number "10" is the read/writable field that indicates in percentage, the lower limit of the ratio of the difference in the number of detections during detection time that is considered as an error range at the time of automatic frequency detection. The value can only be set and changed externally. The MAXIMUM ERROR RANGE SETTING OF NUMBER OF DETECTIONS DURING DETECTION TIME (PERCENTAGE) of the register number "11" is the read/writable field that indicates in percentage, the upper limit of the ratio of the difference in number of detections during detection time that is considered as the error range at the time of automatic frequency detection. The value can only be set and changed externally.

The ENHANCEMENT DETECTING THRESHOLD (PERCENTAGE) of the register number "12" is the read/writable field that indicates in percentage, the threshold of the number of detected edges indicating that the enhancement is carried out at the time of automatic frequency detection. If the ratio of the value stored in the NUMBER OF DETECTIONS DURING MONITORING TIME to the value stored in the NUMBER OF DETECTIONS DURING DETECTION TIME is equal to or more than the threshold, it is considered that the enhancement is carried out and the frequency is detected automatically. In other words, enhancement can be automatically detected even during the monitoring period, thereby enabling to carry out the automatic frequency detection.

The MINIMUM VALUE OF NUMBER OF DETECTIONS DURING MONITORING TIME of the register number "13" is the read/writable field that stores therein the value that is obtained by deducting from the value of the NUMBER OF DETECTIONS DURING DETECTION TIME, the value obtained by multiplying the MINIMUM SETTING DURING DETECTION TIME (PERCENTAGE) by the NUMBER OF DETECTIONS DURING DETECTION TIME. The value cannot only be rewritten by the automatic frequency detecting unit 106 but can also be set and changed externally. Further, the MAXIMUM VALUE OF NUMBER OF DETECTIONS DURING MONITORING TIME of the register number "14" is the read/writable field that stores therein the value that is obtained by deducting from the value of the NUMBER OF DETECTIONS DURING DETECTION TIME, the value obtained by multiplying the MAXIMUM SETTING DURING DETECTION TIME (PERCENTAGE) by the NUMBER OF DETECTIONS DURING DETECTION TIME. The value cannot only be rewritten by the automatic frequency detecting unit 106 but can also be set and changed externally.

The NUMBER OF DETECTIONS DURING MONITORING TIME of the register number "15" is the read/writable field that stores therein the number of detected edges per monitoring unit time that is detected by monitoring the frequency. Thus, the number of detected edges upon frequency abnormality occurrence can be understood.

Next, frequency monitoring processes that are executed in the automatic frequency monitoring circuit that is indicated in FIG. 2 are explained. FIGS. 4 to 7 are time charts of the frequency monitoring processes that are executed in the automatic frequency monitoring circuit indicated in FIG. 2. FIG. 4 is the time chart for performing an initial automatic detection. First, the automatic frequency monitoring circuit 100 detects an automatic frequency detection starting trigger (step S101). Next, the edge detecting unit 105 of the automatic frequency monitoring circuit 100 starts generation of an edge detecting pulse (step S102). The monitoring cycle signals generator 101 and the toggle unit 102 start generation of the monitoring cycle signals (step S103) and the automatic frequency detecting unit 106 determines whether the automatic frequency detection is to be carried out (step S104).

Next, the edge detecting unit 105 detects the monitoring target clock from an other device 300 that generates the monitoring target clock (step S105) and outputs the generated edge detection pulse to the monitoring cycle signals generator 101 and the toggle unit 102 (step S106).

Upon receiving the edge detecting pulse from the edge detecting unit 105, the monitoring cycle signals generator 101 and the toggle unit 102 output the monitoring cycle signals to the automatic frequency detecting unit 106 (step S107). The automatic frequency detecting unit 106 in which the monitoring cycle signals are input by the monitoring cycle signals generator 101 and the toggle unit 102 executes an automatic frequency detection process (step S108). According to the process, the NUMBER OF DETECTIONS DURING DETECTION TIME, the MINIMUM VALUE OF NUMBER OF DETECTIONS DURING MONITORING TIME, and the MAXIMUM VALUE OF NUMBER OF DETECTIONS DURING MONITORING TIME are decided.

The values such as the MINIMUM VALUE OF NUMBER OF DETECTIONS DURING MONITORING TIME and the MAXIMUM VALUE OF NUMBER OF DETECTIONS DURING MONITORING TIME, that are decided at step S108 and the AUTOMATIC DETECTION YES/NO SETTING="No" are output to the storage unit 104 (step S109). The storage unit 104 stores the values in a predetermined location (change of the register (storage unit 104), step S110). Next, the automatic frequency detecting unit 106 outputs the monitoring start instructions to the frequency abnormality detecting unit 103 (step S111).

The automatic frequency monitoring circuit 100 starts monitoring the frequency abnormality (step S112). The frequency abnormality detecting unit 103 executes the frequency monitoring process (step S113). Next, the frequency abnormality detecting unit 103 outputs to the storage unit 104, the number of detected edges that is specified in the frequency monitoring process (step S114) and the storage unit 104 stores the number of detected edges in the predetermined location (change of the register (storage unit 104), step S115).

The number of detected edges in the frequency monitoring process result that is stored in the predetermined location of the storage unit 104 is referred from a software unit 200 of an external device (step S116). The software unit 200 checks the frequency (step S117). The automatic frequency monitoring circuit 100 re-detects the automatic detection starting trigger (step S118) but starts monitoring of the frequency abnormality (step S119).

In the automatic frequency monitoring processes indicated in FIG. 4, when the standard clock is assumed as 100 MHz and the monitoring target clock as 20 MHz and if the MONITORING TIME SETTING of the storage unit 104 is considered as "1000", the actual monitoring time is 10 microseconds. Further, the AUTOMATIC DETECTION YES/NO SETTING is considered as "Yes", the RE-SETTING UPON AUTOMATIC DETECTION as "No", the RE-ACTIVATION INSTRUCTION SETTING as "No" (however, when the AUTOMATIC DETECTION YES/NO SETTING="Yes", the value of the RE-ACTIVATION INSTRUCTION SETTING has no significance) and the NUMBER OF SAMPLINGS as "5". When the MINIMUM SETTING DURING MONITORING TIME (PERCENTAGE) is set as "10%", the MAXIMUM SETTING DURING MONITORING TIME (PERCENTAGE) as "10%", and the number of detected edges according to the automatic frequency detection process is "200", the MINIMUM VALUE OF NUMBER OF DETECTIONS DURING MONITORING TIME becomes "180" and the MAXIMUM VALUE OF NUMBER OF DETECTIONS DURING MONITORING TIME becomes "220". If the number of detected edges specified in the frequency monitoring process result is within the range from "180" to "220", the automatic frequency monitoring circuit 100 considers the frequency as normal. If not, the automatic frequency monitoring circuit 100 considers the frequency as abnormal.

FIG. 5 is the time chart for performing each automatic detection. In FIG. 5, the values of the MINIMUM VALUE OF NUMBER OF DETECTIONS DURING MONITORING TIME and the MAXIMUM VALUE OF NUMBER OF DETECTIONS DURING MONITORING TIME that are decided at step S108, and the AUTOMATIC DETECTION YES/NO SETTING="Yes" are output to the storage unit 104 at step S109. Further, after step S118 and before step S119, steps S102 to S111 are re-executed that differ from the time chart indicated in FIG. 4. The other steps are same as the time chart indicated in FIG. 4.

In the automatic frequency monitoring processes indicated in FIG. 5, when the standard clock is assumed as 100 MHz and the monitoring target clock as 20 MHz and if the MONITORING TIME SETTING of the storage unit 104 is "1000", the actual monitoring time is 10 microseconds. Further, the AUTOMATIC DETECTION YES/NO SETTING is considered as "Yes", the RE-SETTING UPON AUTOMATIC DETECTION as "Yes", the RE-ACTIVATION INSTRUCTION SETTING as "No" (however, when the AUTOMATIC DETECTION YES/NO SETTING="Yes", the value of the RE-ACTIVATION INSTRUCTION SETTING has no significance), and the NUMBER OF SAMPLINGS as "5". When the MINIMUM SETTING DURING MONITORING TIME (PERCENTAGE) is set as "10%", the MAXIMUM SETTING DURING MONITORING TIME (PERCENTAGE) as "10%", and the number of detected edges according to the automatic frequency detection process is "200", the MINIMUM VALUE OF NUMBER OF DETECTIONS DURING MONITORING TIME becomes "180" and the MAXIMUM VALUE OF NUMBER OF DETECTIONS DURING MONITORING TIME becomes "220". If the number of detected edges specified in the frequency monitoring process result is within the range from "180" to "220", the automatic frequency monitoring circuit 100 considers the frequency as normal. If not, the automatic frequency monitoring circuit 100 considers the frequency as abnormal.

FIG. 6 is a time chart for changing setting contents of the storage unit 104 during automatic frequency monitoring. In FIG. 6, the software unit 200 outputs to the storage unit 104, the instructions for changing the setting contents (the MONITORING TIME, the NUMBER OF SAMPLINGS, the AUTOMATIC DETECTION YES/NO SETTING, the MINIMUM SETTING DURING MONITORING TIME (PERCENTAGE), or the MAXIMUM SETTING DURING MONITORING TIME (PERCENTAGE)) (step S98) and the instruction for Re-activation of the automatic frequency monitoring circuit 100 (step S99). According to the re-activation instruction, the automatic frequency monitoring circuit 100 re-activates itself (step S100). Further, the similar processes of steps S102 to S115 indicated in FIG. 4 and FIG. 5 are executed.

Thus, in the automatic frequency monitoring circuit 100, the setting contents of the storage unit 104 can be changed during the automatic frequency monitoring. When the setting contents are changed, the automatic frequency monitoring circuit 100 re-activates itself and the normal frequency abnormality monitoring can be carried out.

In the automatic frequency monitoring processes indicated in FIG. 6, when the standard clock is assumed as 100 MHz and the monitoring target clock as 20 MHz and if the MONITORING TIME SETTING of the storage unit 104 is increased to "2000", the actual monitoring time becomes 20 microseconds. Further, the AUTOMATIC DETECTION YES/NO SETTING is considered as "Yes", the RE-SETTING UPON AUTOMATIC DETECTION as "No", the RE-ACTIVATION INSTRUCTION SETTING as "Yes", and the NUMBER OF SAMPLINGS as "5". When the MINIMUM SETTING DURING MONITORING TIME (PERCENTAGE) is set as "10%", the MAXIMUM SETTING DURING MONITORING TIME (PERCENTAGE) as "10%" and the number of detected edges according to the automatic frequency detection process is "400", the MINIMUM VALUE OF NUMBER OF DETECTIONS DURING MONITORING TIME becomes "360" and the MAXIMUM VALUE OF NUMBER OF DETECTIONS DURING MONITORING TIME becomes "440". If the number of detected edges specified in the frequency monitoring process result is within the range from "360" to "440", the automatic frequency monitoring circuit 100 considers the frequency as normal. If not, the automatic frequency monitoring circuit 100 considers the frequency as abnormal.

FIG. 7 is a time chart for performing the frequency abnormality monitoring based on the value that is calculated from a clock frequency system in an oscillator (OSC) datasheet of the other device 300. Upon setting the AUTOMATIC DETECTION YES/NO SETTING as "No" and the number of detections during monitoring time minimum value and the number of detections during monitoring time maximum value using the value obtained from the OSC datasheet of the other device 300 (step S97), the software unit 200 outputs to the storage unit 104, the instruction for re-activation of the automatic frequency monitoring circuit 100 (step S99). According to the re-activation instruction, the automatic frequency monitoring circuit 100 re-activates itself (step S100). Next, similar to the steps indicated in FIGS. 4, 5, and 6, the processes of steps S102 to S107 and steps S111 to S115 are executed.

Based on the value calculated from the clock frequency system in the OSC datasheet of the other device 300, the automatic frequency monitoring circuit 100 according to the embodiment of the present invention can monitor the frequency abnormality.

In the automatic frequency monitoring processes indicated in FIG. 7, the RE-ACTIVATION INSTRUCTION SETTING is assumed as "Yes". Based on the data of the OSC datasheet of the other device 300, the MINIMUM SETTING DURING MONITORING TIME (PERCENTAGE) is set as "5%" and the MAXIMUM SETTING DURING MONITORING TIME (PERCENTAGE) is set as "10%". Because the number of detected edges according to the automatic frequency detection process is calculated as 20 MHz multiplied by 10 microseconds is equal to "200", the MINIMUM VALUE OF NUMBER OF DETECTIONS DURING MONITORING TIME becomes "190" and the MAXIMUM VALUE OF NUMBER OF DETECTIONS DURING MONITORING TIME becomes "220". If the number of detected edges specified in the frequency monitoring process result is within the range from "190" to "220", the automatic frequency monitoring circuit 100 considers the frequency as normal. If not, the automatic frequency monitoring circuit 100 considers the frequency as abnormal.

Figure 8:
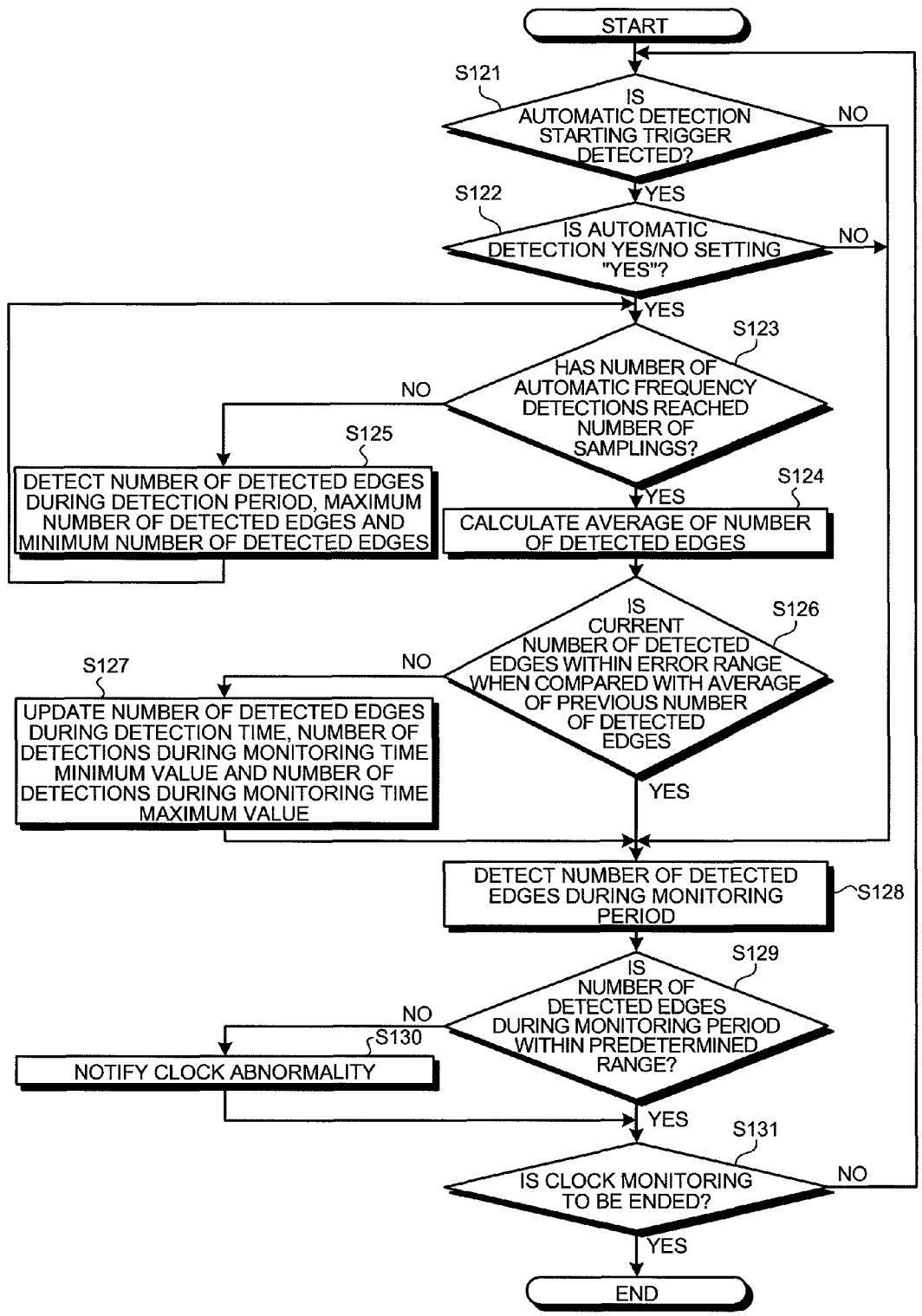
FIG. 8 is a flowchart of the automatic frequency monitoring processes.

Next, the automatic frequency monitoring processes executed in the automatic frequency monitoring circuit that is indicated in FIG. 2 are explained. FIG. 8 is a flowchart of the automatic frequency monitoring processes that are performed by the automatic frequency monitoring circuit 100 that is indicated in FIG. 2. As shown in FIG. 8, first, the automatic frequency detecting unit 106 determines whether the automatic detection starting trigger is detected (step S121). The automatic detection starting trigger is specified for enhancement such as over clocking, or power source reset, activation of the other device 300, or the like. If the automatic detection starting trigger is detected (Yes at step S121), the automatic frequency detecting unit 106 proceeds to step S122. If the automatic detection starting trigger is not detected (No at step S121), the automatic frequency detecting unit 106 proceeds to step S128.

At step S122, the automatic frequency detecting unit 106 determines whether the automatic detection Yes/No setting is "Yes". If the automatic detection Yes/No setting is "Yes" (Yes at step S122), the automatic frequency detecting unit 106 proceeds to step S123 and if the automatic detection Yes/No setting is not "Yes" (No at step S122), the automatic frequency detecting unit 106 proceeds to step S128.

At step S123, the automatic frequency detecting unit 106 determines whether the number of times of automatic frequency detections has reached the number of samplings. If the number of times of automatic frequency detections has reached the number of samplings (Yes at step 123), the automatic frequency detecting unit 106 proceeds to step S124. If the number of times of automatic frequency detections has not reached the number of samplings (No at step 123), the automatic frequency detecting unit 106 detects the number of detected edges during detection period, the maximum number of detected edges, and the minimum number of detected edges (step S125).

At step S124, the total number of detected edges of the number of samplings is divided by the number of samplings to calculate the average of the number of detected edges. The automatic frequency detecting unit 106 compares the current number of detected edges that is calculated at step S124 with the previous number of detected edges that is stored in the NUMBER OF DETECTIONS DURING DETECTION TIME of the storage unit 104 and determines whether the number of detected edges is within the error range that is decided in the MINIMUM ERROR RANGE SETTING OF NUMBER OF DETECTIONS DURING DETECTION TIME (PERCENTAGE) and the MAXIMUM ERROR RANGE SETTING OF NUMBER OF DETECTIONS DURING DETECTION TIME (PERCENTAGE) of the storage unit 104 (step S126). If the number of detected edges is within the error range (Yes at step S126), the automatic frequency detecting unit 106 proceeds to step S128. If the number of detected edges is outside the error range (No at step S126), the automatic frequency detecting unit 106 updates the NUMBER OF DETECTIONS DURING DETECTION TIME with the data of the WORK AREA OF NUMBER OF DETECTIONS DURING DETECTION TIME and also updates the MINIMUM VALUE OF NUMBER OF DETECTIONS DURING MONITORING TIME and the MAXIMUM VALUE OF NUMBER OF DETECTIONS DURING MONITORING TIME based on the updated NUMBER OF DETECTIONS DURING DETECTION TIME (step S127).

At step S128, the frequency abnormality detecting unit 103 detects the number of detected edges during frequency monitoring period and monitors a monitoring target frequency. Further, the frequency abnormality detecting unit 103 determines whether the number of detected edges during monitoring period is within the range that is decided in the MINIMUM VALUE OF NUMBER OF DETECTIONS DURING MONITORING TIME and the MAXIMUM VALUE OF NUMBER OF DETECTIONS DURING MONITORING TIME that are stored in the storage unit 104 (step S129). If the number of detected edges during monitoring period is within the range that is decided in the MINIMUM VALUE OF NUMBER OF DETECTIONS DURING MONITORING TIME and the MAXIMUM VALUE OF NUMBER OF DETECTIONS DURING MONITORING TIME (Yes at step S129), the frequency abnormality detecting unit 103 proceeds to step S131. If the number of detected edges during monitoring period is outside the range that is decided in the MINIMUM VALUE OF NUMBER OF DETECTIONS DURING MONITORING TIME and the MAXIMUM VALUE OF NUMBER OF DETECTIONS DURING MONITORING TIME (No at step S129), the frequency abnormality detecting unit 103 notifies the clock abnormality to the external device (specifically, the software unit 200) (step S130).

At step S131, the frequency abnormality detecting unit 103 determines whether the clock monitoring is to be ended. If the clock monitoring is to be ended (Yes at step S131), the frequency abnormality detecting unit 103 ends the automatic frequency monitoring process. If the clock monitoring is to be continued (No at step S131), the frequency abnormality detecting unit 103 proceeds to step S121.

The embodiment of the present invention is explained above, however, the present invention is not to be thus limited. The present invention is applicable to various embodiments that are within the range of technical aspects mentioned in the claims.

All the automatic processes explained in the present embodiment can be, entirely or in part, carried out manually. Similarly, all the manual processes explained in the present embodiment can be, entirely or in part, carried out automatically by a known method. The process procedures, the control procedures, specific names, and data, including various parameters mentioned in the embodiment can be changed as required unless otherwise specified. For example, the percentage mentioned in the embodiment can be the ratio of two values or can be the ratio of difference between two values.

The constituent elements of the device illustrated are merely conceptual and may not necessarily physically resemble the structures shown in the drawings. For instance, the device need not necessarily have the structure that is illustrated. The device as a whole or in parts can be distributed or integrated either functionally or physically in accordance with the load or how the device is to be used.

The process functions performed by the device are entirely or partially realized by a central processing unit (CPU) (or microcomputers such as a micro processing unit (MPU), a micro controller unit (MCU), or a program executed by the CPU (or the microcomputers such as the MPU and the MCU) or by a hardware using wired logic.

According to an embodiment of the present invention, based on the detection frequency, a predetermined fluctuation range is decided, thereby enabling to automatically monitor a frequency of a monitoring target clock.

According to an embodiment of the present invention, changes in the detection frequency are automatically detected. Thus, based on the changed detection frequency, the frequency of the monitoring target clock can be automatically monitored.

According to an embodiment of the present invention, when it is determined that the detection frequency is not changed, because a predetermined range need not to be changed, based on a consistent basis, the frequency of the monitoring target clock can be automatically monitored.

According to an embodiment of the present invention, changing the predetermined range unnecessarily according to setting is not needed. Thus, based on the consistent basis, the frequency of the monitoring target clock can be automatically monitored.

According to an embodiment of the present invention, by freely changing the setting during automatic monitoring, a flexibility of application can be improved.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An automatic frequency monitoring circuit that automatically monitors a frequency of a clock related to an operation of a device to be monitored comprising:

a frequency detector that detects, upon detecting a predetermined momentum, frequencies of a target clock during a predetermined time for a plurality number of times and treats as a detection frequency of the target clock, an average of the frequencies that are detected for the plurality number of times; and a frequency monitor that monitors, upon the frequency detector detecting the detection frequency of the target clock, whether the frequency of the target clock during the predetermined time is within a predetermined fluctuation range based on the detection frequency, wherein the frequency monitor determines whether the frequency monitor monitors whether the frequency of the target clock during the predetermined time is within the predetermined fluctuation range, based on whether a difference or a ratio between a first detection frequency of the target clock that is previously detected by the frequency detector and a second detection frequency of the target clock that is currently detected by the frequency detector exceeds a predetermined threshold, wherein the frequency monitor detects, upon detecting the predetermined momentum only upon the difference or the ratio between the first detection frequency of the target clock that is previously detected by the frequency detector and the second detection frequency of the target clock that is currently detected by the frequency detector exceeding the predetermined threshold during monitoring the target clock, that the target clock is updated, and monitors whether the frequency of the target clock during the predetermined time is within the predetermined fluctuation range based on the second detection frequency.

2. The automatic frequency monitoring circuit according to claim 1, wherein the frequency monitor monitors, upon the difference or the ratio between the first detection frequency of the target clock that is previously detected by the frequency detector and the second detection frequency of the target clock that is currently detected by the frequency detector being within a predetermined range, whether the frequency of the target clock during the predetermined time is within the predetermined fluctuation range based on the first detection frequency.

3. The automatic frequency monitoring circuit according to claim 1, wherein the frequency detector detects or does not detect the detection frequency of the target clock, upon detecting the predetermined momentum after the frequency detector detects the frequency of the target clock, according to re-detection setting that indicates whether re-detection of the detection frequency of the target clock is to be carried out.

4. The automatic frequency monitoring circuit according to claim 3 further includes a storage unit that stores therein the predetermined time, the predetermined frequency, the predetermined fluctuation range, the predetermined threshold, or the predetermined re-detection setting that is capable of being re-written, wherein the predetermined time, the predetermined frequency, the predetermined fluctuation range, the predetermined threshold, or the predetermined re-detection setting that are stored in the storage unit is capable of being re-written, regardless of the detection frequency of the target clock being detected by the frequency detector or the frequency of the target clock being monitored by the frequency monitor, by external instructions.

5. The automatic frequency monitoring circuit according to claim 1, wherein
the frequency monitor outputs, upon detecting the frequency of the target clock outside the predetermined fluctuation range during the predetermined time, warning signals to external devices.

6. An electronic device that automatically monitors a frequency of a clock related to an operation of the electronic device itself comprising:
a frequency detector that detects, upon detecting a predetermined momentum, frequencies of a target clock during a predetermined time for a plurality number of times and treats as a detection frequency of the target clock, an average of the frequency that is detected for the plurality number of times; and
a frequency monitor that monitors, upon the frequency detector detecting the detection frequency of the target clock, whether the frequency during the predetermined time is within a predetermined fluctuation range based on the detection frequency, wherein the frequency monitor determines whether the frequency monitor monitors whether the frequency of the target clock during the predetermined time is within the predetermined fluctuation range, based on whether a difference or a ratio between a first detection frequency of the target clock that is previously detected by the frequency detector and a second detection frequency of the target clock that is currently detected by the frequency detector exceeds a predetermined threshold, wherein
the frequency monitor detects, upon detecting the predetermined momentum only upon the difference or the ratio between the first detection frequency of the target clock that is previously detected by the frequency detector and the second detection frequency of the target clock that is currently detected by the frequency detector exceeding the predetermined threshold during monitoring the target clock, that the target clock is updated, and monitors whether the frequency of the target clock during the predetermined time is within the predetermined fluctuation range based on the second detection frequency.

7. An automatic frequency monitoring method for automatically monitoring a frequency of a clock related to an operation of a device to be monitored, the automatic frequency monitoring method comprising:
frequency detecting including
detecting, upon detecting a predetermined momentum, frequencies of a target clock during a predetermined time for a plurality number of times, using a processor and treating as a detection frequency of the target clock, an average of the frequencies that are detected for the plurality number of times, using a microprocessor; and
monitoring, upon the frequency detecting detecting the detection frequency of the target clock, whether the frequency of the target clock during the predetermined time is within a predetermined fluctuation range based on the detection frequency, using a processor, wherein
the monitoring includes determining whether to monitor whether the frequency of the target clock during the predetermined time is within the predetermined fluctuation range, based on whether a difference or a ratio between a first detection frequency of the target clock that is previously detected and a second detection frequency of the target clock that is currently detected exceeds a predetermined threshold, using a processor, wherein
the monitoring includes detecting, upon detecting the predetermined momentum only upon the difference or the ratio between the first detection frequency of the target clock that is previously detected by the frequency detecting and the second detection frequency of the target clock that is currently detected by the frequency detecting exceeding the predetermined threshold during monitoring the target clock, that the target clock is updated, and monitoring whether the frequency of the target clock during the predetermined time is within the predetermined fluctuation range based on the second detection frequency, using a processor.

8. A non-transitory computer-readable recording medium that stores therein a computer program for automatically monitoring a frequency of a clock related to an operation of a device to be monitored, the computer program causing a computer to execute:
frequency detecting including
detecting, upon detecting a predetermined momentum, frequencies of a target clock during a predetermined time for a plurality number of times and
treating as a detection frequency of the target clock, an average of the frequencies that are detected for the plurality number of times; and
monitoring, upon the frequency detecting detecting the detection frequency of the target clock, whether the frequency of the target clock during the predetermined time is within a predetermined fluctuation range based on the detection frequency, wherein
the monitoring includes determining whether to monitor whether the frequency of the target clock during the predetermined time is within the predetermined fluctuation range, based on whether a difference or a ratio between a first detection frequency of the target clock that is previously detected and a second detection frequency of the target clock that is currently detected exceeds a predetermined threshold, wherein
the monitoring includes detecting, upon detecting the predetermined momentum only upon the difference or the ratio between the first detection frequency of the target clock that is previously detected by the frequency detecting and the second detection frequency of the target clock that is currently detected by the frequency detecting exceeding the predetermined threshold during monitoring the target clock, that the target clock is updated, and monitoring whether the frequency of the target clock during the predetermined time is within the predetermined fluctuation range based on the second detection frequency.

* * * * *